United States Patent
Emma et al.

(10) Patent No.: US 10,304,802 B2
(45) Date of Patent: May 28, 2019

(54) INTEGRATED WAFER-LEVEL PROCESSING SYSTEM

(71) Applicant: International Business Machines Corporation, Armonk, NY (US)

(72) Inventors: Philip G. Emma, Danbury, CT (US); Hillery C. Hunter, Chappaqua, NY (US); John U. Knickerbocker, Monroe, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 32 days.

(21) Appl. No.: 15/143,801

(22) Filed: May 2, 2016

(65) Prior Publication Data

US 2017/0317055 A1 Nov. 2, 2017

(51) Int. Cl.
*H01L 25/065* (2006.01)
*G06F 3/06* (2006.01)
*H01L 25/00* (2006.01)
*H01L 25/18* (2006.01)
*H01L 23/544* (2006.01)
(Continued)

(52) U.S. Cl.
CPC .......... *H01L 25/0657* (2013.01); *G02B 6/122* (2013.01); *G11C 29/006* (2013.01); *G11C 29/56016* (2013.01); *H01L 21/78* (2013.01); *H01L 23/3675* (2013.01); *H01L 23/49838* (2013.01); *H01L 23/544* (2013.01); *H01L 25/18* (2013.01); *H01L 25/50* (2013.01); *G11C 11/401* (2013.01); *G11C 29/42* (2013.01); *G11C 29/52* (2013.01); *H01L 2223/54453* (2013.01);
(Continued)

(58) Field of Classification Search
CPC .............. H01L 21/78; H01L 21/76898; H01L 2223/54453; H01L 2223/06541; H01L 2223/06589
See application file for complete search history.

(56) References Cited

U.S. PATENT DOCUMENTS 4,955,523 A * 9/1990 Carlommagno ........ H01L 24/11
219/56.21
5,309,011 A * 5/1994 Tazunoki .............. H01L 23/147
257/390
(Continued)

FOREIGN PATENT DOCUMENTS

EP 1269538 B1 11/2003
WO 2010151506 A1 12/2010
(Continued)

OTHER PUBLICATIONS

Cheng-Ta Ko, et al; "Wafer-level bonding/stacking technology for 3D integration," Microelectronics Reliability 50 (2010), pp. 481-488.
(Continued)

*Primary Examiner* — Peniel M Gumedzoe
(74) *Attorney, Agent, or Firm* — Cantor Colburn LLP; L. Jeffrey Kelly

(57) ABSTRACT

Examples of techniques for an integrated wafer-level processing system are disclosed. In one example implementation according to aspects of the present disclosure, an integrated wafer-level processing system includes a memory wafer and a processing element connected to the memory wafer via a data connection.

4 Claims, 4 Drawing Sheets

(51) Int. Cl.
*H01L 23/528* (2006.01)
*H01L 23/498* (2006.01)
*H01L 23/367* (2006.01)
*H01L 21/78* (2006.01)
*H01L 21/768* (2006.01)
*H01L 23/48* (2006.01)
*G02B 6/122* (2006.01)
*G11C 29/52* (2006.01)
*G06F 11/10* (2006.01)
*G11C 29/00* (2006.01)
*G11C 29/56* (2006.01)
*G11C 11/401* (2006.01)
*G11C 29/42* (2006.01)

(52) U.S. Cl.
CPC ............... *H01L 2225/06541* (2013.01); *H01L 2225/06589* (2013.01)

(56) References Cited

U.S. PATENT DOCUMENTS

| | | | | |
|---|---|---|---|---|
| 5,463,249 | A * | 10/1995 | Shinbo | H01L 23/5385 257/690 |
| 5,701,666 | A * | 12/1997 | DeHaven | G01R 1/07314 29/593 |
| 6,476,503 | B1 * | 11/2002 | Imamura | H01L 21/561 257/737 |
| 6,582,992 | B2 * | 6/2003 | Poo | H01L 23/481 257/686 |
| 6,936,929 | B1 * | 8/2005 | Mostafazadeh | H01L 21/561 257/777 |
| 8,415,783 | B1 | 4/2013 | Rahman et al. | |
| 2003/0157748 | A1 * | 8/2003 | Kim | H01L 21/76804 438/107 |
| 2004/0188819 | A1 | 9/2004 | Farnworth et al. | |
| 2007/0023887 | A1 * | 2/2007 | Matsui | H01L 24/73 257/686 |
| 2008/0006931 | A1 * | 1/2008 | Oliver | H01L 21/561 257/712 |
| 2010/0072599 | A1 | 3/2010 | Camacho et al. | |
| 2013/0015578 | A1 | 1/2013 | Thacker et al. | |
| 2013/0040423 | A1 | 2/2013 | Tung et al. | |
| 2016/0190098 | A1 * | 6/2016 | Chen | H01L 23/3128 257/774 |
| 2016/0334991 | A1 * | 11/2016 | Berger | G06F 3/0604 |
| 2017/0123987 | A1 * | 5/2017 | Cheng | G06F 12/0862 |

FOREIGN PATENT DOCUMENTS

| | | |
|---|---|---|
| WO | 2014011281 A1 | 1/2014 |
| WO | 2014100090 A1 | 6/2016 |

OTHER PUBLICATIONS

K. Sakuma, et al., "3D chip-stacking technology with through-silicon vias and low-volume leadfree interconnections," IBM J. Res. & Dev. vol. 52 No. 6 Nov. 2008, pp. 611-622.

* cited by examiner

INTEGRATED WAFER-LEVEL PROCESSING SYSTEM

BACKGROUND

The present disclosure relates to processing systems and, more particularly, to an integrated wafer-level processing system.

Server and cloud computing solutions need low cost memory with higher bandwidth and much lower latency for improved performance. Current packaging solutions can be used but have limitations on bandwidth, latency and cost.

Current implementations may use a board trace to connect a processor to memory cards (i.e., a multiplicity of dual in-line memory modules (DIMMs)). Current implementations using a board (e.g., a motherboard) to connect a processor to memory cards use longer communicative paths that result in slower data transfer between the processor and the memory. Moreover, current implementations utilize course pin connects that limit the number of connections between the processor and the memory cards. Additionally, the inclusion of the board, associated packaging, and interconnections to connect the processor to the memory increases cost.

In current implementations, each DIMM contains groups of dynamic random-access memory (DRAM) chips (e.g., 8 DRAM chips per DIMM, 16 DRAM chips per DIMM, etc.) referred to as a rank. A rank of DRAM chips responds together to a memory command (e.g., a read command, a write command, etc.), and, in a processing system, a rank may include extra DRAM chips on each DIMM (e.g., 1-2 spares) for backup purposes. Error checking and correcting codes enable one of these DRAM chips in a rank to become partially or completely bad, and the processing system is still able to function with correct data.

SUMMARY

According to examples of the present disclosure, an integrated wafer-level processing system is provided. An example integrated-wafer level processing system includes a memory wafer and a processing element connected to the memory wafer via a data connection.

An alternate example integrated-wafer level processing system includes a plurality of memory wafers connected together and a processing element connected to at least one of the plurality of memory wafers via a data connection.

An alternate example integrated-wafer level processing system includes a memory wafer and a plurality of processing elements. Each of the plurality of processing elements is connected to the memory wafer via a data connection.

An alternate example integrated-wafer level processing system includes a plurality of memory wafers connected together and a plurality of processing elements. Each of the plurality of processing elements is connected to at least one of the plurality of memory wafers via a data connection.

An example memory wafer includes a plurality of memory elements and a processing element connected to the plurality memory elements.

In some implementations, the present techniques reduce the distance commands and data travel between the processing element and the memory elements on the memory wafer. In some examples, the distance may be reduced by approximately 50%. Consequently, the present techniques also reduce the time the commands and data take to travel between the processing element and the memory elements on the memory wafer. The present techniques also provide more connections between the processing element and the memory elements than traditional implementations that utilize longer circuit board connections positioned between the processing and memory elements, without occupying additional physical space. By removing the traditional circuit board between the processing and memory elements and utilizing options such as but not limited to high bandwidth wiring from traditional semiconductor processing for on wafer high bandwidth, silicon packaging high density bandwidth, and/or high density organic or other dielectric packaging to create more paths for transferring data between the processor and the memory elements are possible. Since the traditional circuit board itself can be eliminated, the singulation of memory die (elements) and their associated packaging can be eliminated when replaced with memory elements within wafers, there is opportunity for manufacturing cost reduction, overall wiring length reduction, and overall system size demands are reduced. Integrated cooling to support microprocessors, memory wafers, and/or memory stacks can also be achieved with integrated liquid cooling, integrated liquid cooling and air cooling, air cooling only or combinations of other thermal solutions.

Additional features and advantages are realized through the techniques of the present disclosure. Other aspects are described in detail herein and are considered a part of the disclosure. For a better understanding of the present disclosure with the advantages and the features, refer to the following description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages thereof, are apparent from the following detailed description taken in conjunction with the accompanying drawings in which:

DETAILED DESCRIPTION

Various implementations are described below by referring to several examples of an integrated wafer-level processing system that packages a processing element on a memory wafer. The integrated wafer-level processing system may include a memory wafer and a processing element connected to the memory wafer via a data connection. According to aspects of the present disclosure, an integrated wafer-lever processing system may include multiple memory wavers and/or multiple processing elements In some implementations, the present techniques reduce the distance commands and data travel between the processing element and the memory elements on the memory wafer. In some examples, the distance may be reduced by approximately 50%. Consequently, the present techniques also reduce the time the commands and data take to travel between the processing element and the memory elements on the memory wafer. The present techniques also provide more connections between the processing element and the memory elements than traditional implementations that utilize a circuit board positioned between the processing and memory elements without occupying additional physical space. By eliminating the need for coupling the processor-to-memory data path through long circuit board or a similar long intermediary element connection, more short paths for transferring data between the processor and the memory elements are possible. This is made possible by use of on wafer wiring and/or interconnections, use of a high number of short connections from processor to memory die, die stacks and/or memory wafers or through the package to a chip, chip stack and or memory wafer or wafers. In part, because the circuit board itself is eliminated or length of connections from processor to memory is substantially reduced, manufacturing costs and size demands are reduced. These and other advantages will be apparent from the description that follows.

Figure 1A:
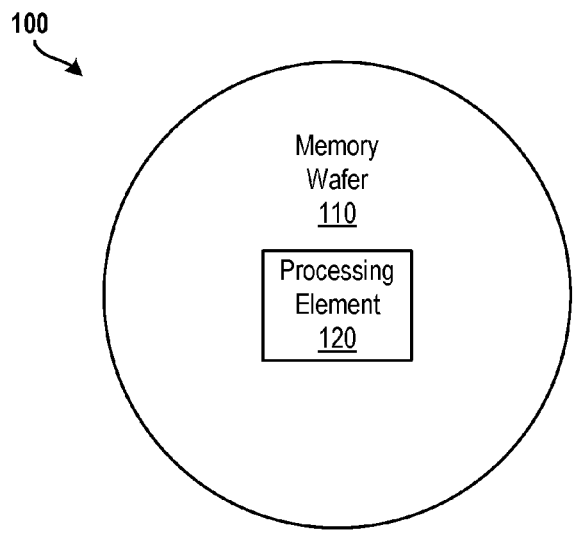
FIG. 1A illustrates a top view and FIG. 1B illustrates a side view of a block diagram of an embodiment of an integrated wafer-level processing system according to aspects of the present disclosure.
Figure 1B:
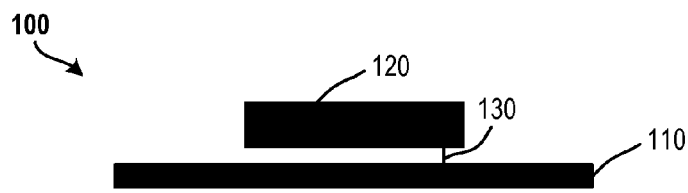

FIG. 1A illustrates a top view and FIG. 1B illustrates a side view of a block diagram of an embodiment of an integrated wafer-level processing system 100 according to aspects of the present disclosure. The integrated wafer-level processing system 100 comprises a memory wafer 110 and a processing element 120 that is connected to the memory wafer 110 via a data connection 130 (illustrated in FIG. 1B). It should be appreciated that the processing element 120 connects to the memory wafer 110 directly without the use of an intermediate circuit board (e.g., a mother board), although, in examples, an intermediate package may be used as described herein.

It should be appreciated that the data connection 130 may pass directly from the processing element 120 to the memory wafer 110 or from the processing element 120 through a package and then to the memory wafer 110. In the latter case with use of a package, the package may also serve to provide power to and distribution therein to the processing element 120 and/or the memory wafer 110. The data connection 130 connecting the memory wafer 110 and the processing element 120 may be an electrical connection (i.e., a wired connection) or may be an optical connection. This provides flexibility in pairing memory wafers and processing elements as well as providing increased bandwidth over conventional techniques. In examples, the memory wafer 110 comprises a wiring interconnect to enable the processing element 120 to connect to the memory wafer 110 via the data connection 130. For example, an interconnection for data, other communications, and/or power may be provided through a package. Additional data connections may be implemented in alternate embodiments.

In examples, the memory wafer 110 includes course grid wiring to enable power to be supplied to the processing system 100. In other examples, a package, such as an organic package, a silicon package, a glass or alternate dielectric package(s) may be used to provide power to the memory and/or processor die. Signal interconnections may be based on electrical interconnections across a wafer, across an organic package, a silicon package, a glass package and/or in combination with optical connections such as but not limited to glass wave guide (fiber) interconnections, wave guide interconnection(s), or a ceramic package, in between the processing element 120 and the memory wafer 110. The packages may be mounted horizontally on the wafers or vertically from the wafers and, in examples, may include flex packaging, organic packaging, ceramic packaging and/or integrated inductors, integrated decoupling capacitors or active voltage circuit controls.

In examples, the integrated wafer-level processing system 100 further comprises a cooling unit (or multiple cooling units). The cooling unit may be a passive cooling unit, such as a heat sync, heat spreader, or may be an active cooling unit such as an air cooling unit (e.g., a fan) such as with heat cooling fins, a liquid (e.g., water) cooling unit, and/or an integrated hybrid air and liquid cooling solution.

Additionally, in aspects of the present disclosure, the processing system 100 may include a package (also referred to as an interposer) to provide integrated decoupling for power distribution to the memory wafer 110 and the processing element 120. The package enables course wiring connections to carry power to the integrated wafer-level processing system 100. The package may also provide for off-processing system communication.

In some examples, field programmable gate arrays (FPGAs) may be used to complement the processing element 120 to provide acceleration for certain types of processing activities. This enables the processing element 120 to execute commands more quickly.

Memory stacks may be used to stack extra memory elements adjacent to the processing element 110 to provide additional memory elements to the processor. For example, a hybrid memory cube (HMC), high-bandwidth memory (HBM) or other high density and/or high bandwidth memory elements may be implemented to provide a localized extra memory boost in close proximity to the processing element or combinations of various types of memory in the system.

Figure 2:
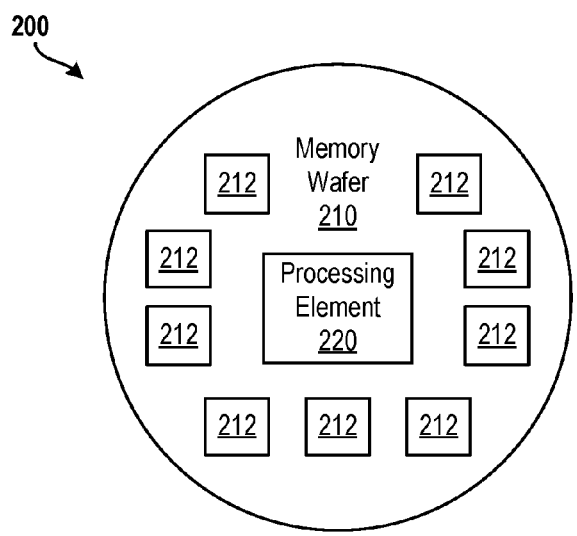
FIG. 2 illustrates a block diagram of an integrated wafer-level processing system comprising a processing element connected to a memory wafer that contains memory elements according to aspects of the present invention.

FIG. 2 illustrates a block diagram of an alternate embodiment of an integrated wafer-level processing system 200 according to aspects of the present disclosure. The integrated wafer-lever processing system 200 comprises a memory wafer 210 and a processing element 220. The processing element 220 is connected to the memory wafer 210 via a data connection.

The memory wafer 210 comprises a plurality of memory elements 212. Each of the plurality of memory elements may be a dynamic random access memory (DRAM) element, a flash memory element, or other suitable type of memory element. In some examples, each of the plurality of memory elements 212 is the same type of memory element (i.e., each of the plurality of memory elements 212 is a DRAM memory element). However, in some examples, the plurality of memory elements 212 comprises different types of memory elements (e.g., a DRAM memory element, a flash memory element, etc.). It should be appreciated that, although only 9 memory elements 212 are illustrated in FIG. 2, the memory wafer 210 may contain hundreds or even thousands of memory elements.

The memory elements 212 may include wafers such as DRAM, RRAM, SRAM, non-volatile memory, Flash Memory, Phase Change Memory, and/or combinations with memory stacks with or without logic control chips per chip stack. The memory elements 212 may also include memory interface chips to one or more memory elements 212 within the memory wafer 210 and/or the one or more memory chip stacks.

In aspects of the present disclosure, the memory elements 212 of the memory wafer 210 are connected to the processing element 220 using rank groups of, for example, 9 to 18 memory elements such as those used in traditional implementations. In examples, four ranks can be connected. In this example, this means that approximately 216-288 memory elements (which may be roughly the number of memory elements on a memory wafer) can be connected per processing element.

In addition to using many memory elements purely for capacity, bad/failed memory elements on the memory wafer 210 can be ameliorated via error checking and correcting (ECC) techniques (i.e., a bad memory element may be electronically turned off). This enables fault tolerance, test, and repair for the processing system 210. In addition, known good die (KGD) techniques may be applied to the memory wafer 210 to test the memory elements 212 during and/or after manufacture to verify the integrity and functionality of the memory wafer 210. In examples, memory elements 212 that are positioned near the outer edge of the memory wafer 210, vertical connections between the memory elements on another memory wafer may be used.

Figure 3:
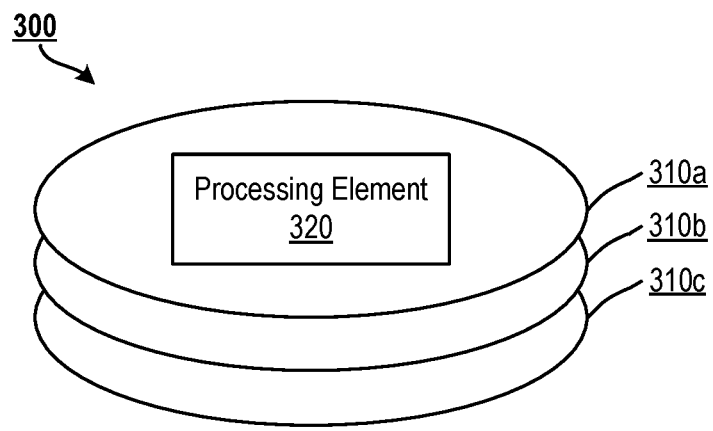
FIG. 3 illustrates a block diagram of an alternate embodiment of an integrated wafer-level processing system comprising a plurality of memory wafers according to aspects of the present invention.

FIG. 3 illustrates a block diagram of an alternate embodiment of an integrated wafer-level processing system 300 according to aspects of the present disclosure. The integrated wafer-level processing system 300 includes a plurality of memory wafers 310a, 310b, 310c connected together. In the example of FIG. 3, the processing system 300 includes vertical connections among the plurality of memory wafers 310a, 310b, 310c. The memory wafers 310a, 310b, 310c may be physically connected, such as by solder, bonding, etc.

To enable the plurality of memory wafers 310a, 310b, 310c to communicate, the memory wafers may be thinner than traditional wafers. For example, in the present embodiment of FIG. 3, the plurality of memory wafers 310a, 310b, 310c may be on the order of 50 microns in thickness as opposed to traditional wafers that may be on the order of 780 microns in thickness. The plurality of memory wafers 310a, 310b, 310c may be mounted to a physical structure to support the memory wafers. The physical structure may be manufactured from silicon, ceramic, metal, plastic, or other suitable materials.

The vertical connections between the plurality of memory wafers 310a, 310b, 310c utilize through silicon vias (TSVs) to establish data connection between the plurality of memory wafers 310a, 310b, 310c. This allows for short communicative connections between the plurality of memory wafers 310a, 310b, 310c compared to traditional implementations using a circuit board between the memory elements and processing elements.

In examples, the plurality of memory wafers 310a, 310b, 310c may be heterogeneous in that the memory wafers may vary in type (e.g., memory wafers 310a, 310b may include DRAM memory elements and memory wafer 310c may include flash memory elements) or may be homogeneous in that the memory wafers may be of the same type (e.g., memory wafers 310a, 310b, 310c include DRAM memory elements). Additionally, each of the memory wafers may individually be heterogeneous (e.g., memory wafer 310a includes DRAM memory elements and flash memory elements) or homogeneous (e.g., memory wafer 310b includes only DRAM memory elements).

The integrated wafer-level processing system 300 also includes a processing element 320 connected to at least one of the plurality of memory wafers 310a, 310b, 310c via a data connection.

In examples, a first memory wafer (e.g., memory wafer 310a) of the plurality of memory wafers is stacked on top of a second memory wafer (e.g., memory wafer 310b) of the plurality of memory wafers. The first memory wafer is connected to the second memory wafer, such as through a through silicon via. A third memory wafer (e.g., memory wafer 310c) may be stacked under and connected to the second memory wafer (e.g. memory wafer 310b).

Additionally, each of the plurality of memory wafers may include a dicing channel or channels. The dicing channel may be used for at least one of a through silicon electrical via and a through silicon optical via to connect the first memory wafer of the plurality of memory wafers to the second memory wafer of the plurality of memory wafers. In examples, the dicing channels may be utilized for heat transfer and power delivery. The dicing channel defines a space between the memory elements on a wafer that is intentionally created to permit post-wafer processing dicing or singulation of processing elements from the memory wafer as well as any space on a memory wafer in addition to the dicing channel that may be available other than for active die processing. In other examples, connections formed between two memory wafers not using the dicing channel can include space or areas between the active memory wafer and/or memory elements and perimeter edge of a memory wafer. This may include the outer 1 to 3 mm of the memory wafer for example.

Figure 4:
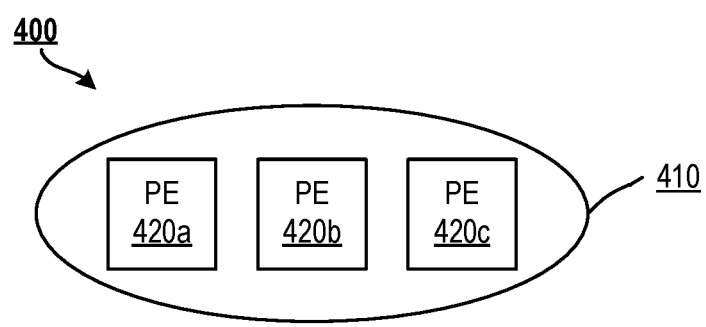
FIG. 4 illustrates a block diagram of an alternate embodiment of an integrated wafer-level processing system comprising a plurality of processing elements according to aspects of the present invention.

FIG. 4 illustrates a block diagram of an alternate embodiment of an integrated wafer-level processing system 400 according to aspects of the present disclosure. The integrated wafer-level processing system 400 includes a memory wafer 410 and a plurality of processing elements 420a, 420b, 420c. Each of the plurality of processing elements 420a, 420b, 420c is connected to the memory wafer 410 via a data connection (e.g., an electrical connection, an optical connect, etc.).

Figure 5:
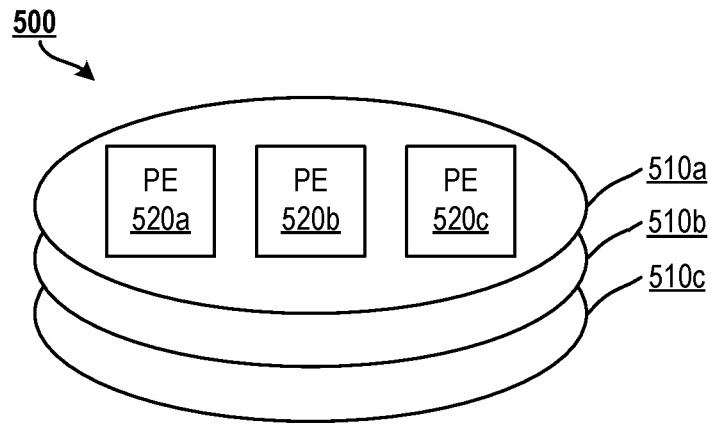
FIG. 5 illustrates a block diagram of an alternate embodiment of an integrated wafer-level processing system comprising a plurality of memory wafers and a plurality of processing elements according to aspects of the present invention.

FIG. 5 illustrates a block diagram of an alternate embodiment of an integrated wafer-level processing system 500 according to aspects of the present disclosure. The integrated wafer-level processing system 500 includes a plurality of memory wafers 510a, 510b, 510c, connected together.

The integrated wafer-level processing system 500 also includes a plurality of processing elements 520a, 520b, 520c connected to at least one of the plurality of memory wafers via a data connection. In the example of FIG. 5, processing elements 520a, 520b, 520c are connected to the memory wafer 510a.

Figure 6:
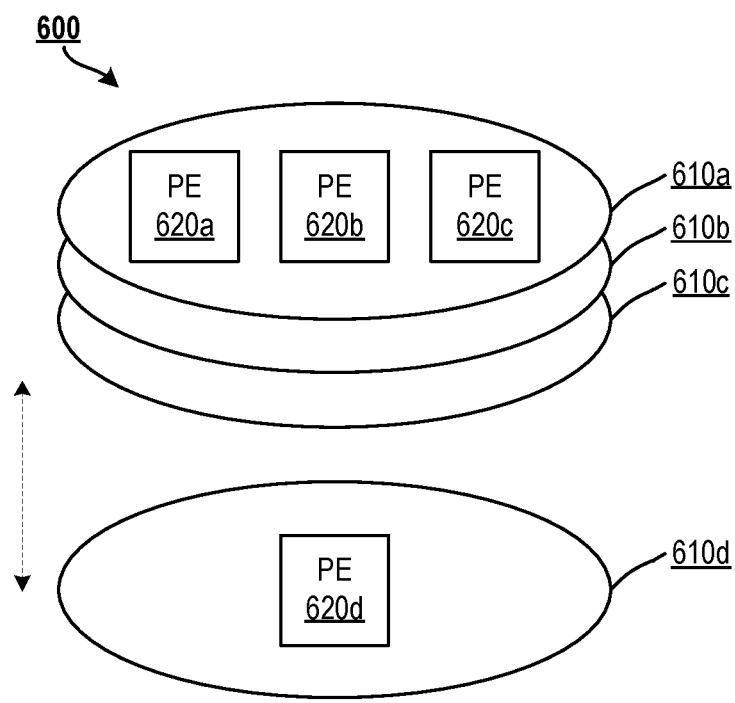
FIG. 6 illustrates a block diagram of an alternate embodiment of multiple integrated wafer-level processing systems connected together according to aspects of the present invention.

FIG. 6 illustrates a block diagram of an alternate embodiment of an integrated wafer-level processing system 600 according to aspects of the present disclosure. The integrated wafer-level processing system 600 includes a plurality of memory wafers 610a, 610b, 610c, 610d connected together.

The integrated wafer-level processing system 600 also includes a plurality of processing elements 620a, 620b, 620c, 620d connected to at least one of the plurality of memory wafers 610a, 610b, 610c, 610d via a data connection. In the example of FIG. 6, processing elements 620a, 620b, 620c are connected to the memory wafer 610a and the processing element 620d is connected to the memory wafer 610d. It should be appreciated that any of the plurality of memory wafers 610a, 610b, 610c, 610d may comprise a processing element or multiple processing elements.

Figure 7:
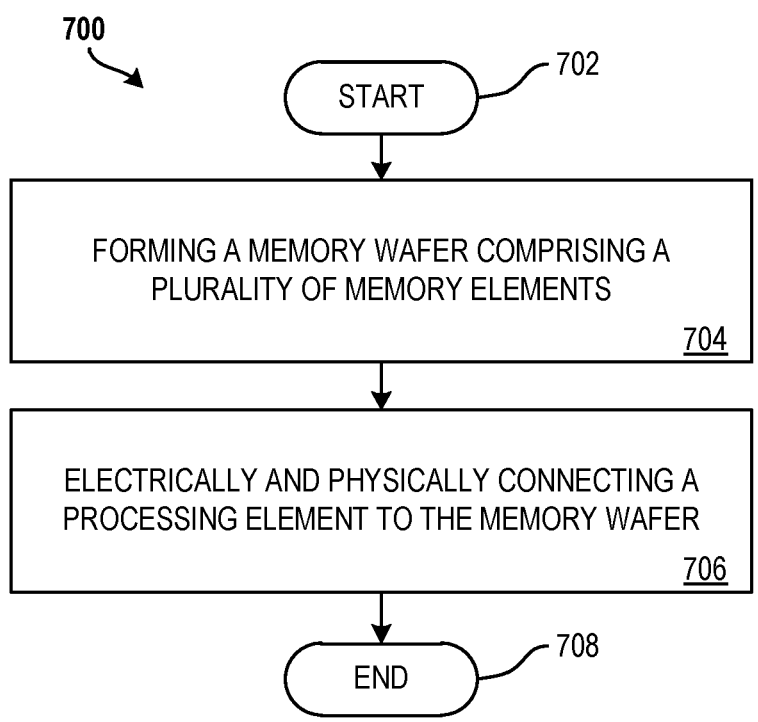
FIG. 7 illustrates a flow diagram of a method for manufacturing an integrated wafer-level processing system according to aspects of the present disclosure.

FIG. 7 illustrates a flow diagram of a method 700 for manufacturing an integrated wafer-level processing system according to aspects of the present disclosure. The method 700 starts at block 702 and continues to block 704. At block 740, the method 700 includes forming a memory wafer comprising a plurality of memory elements. The method 700 continues to block 706. At block 706, the method 700 includes electrically and physically connecting a processing element to the memory wafer, wherein the processing element is configured to transmit data to and receive data from the plurality of memory elements. The method continues to block 708 and ends.

Additional processes also may be included. For example, the method 700 may include forming a dicing channel on the memory wafer. The dicing channel may be used for at least one of a through silicon electrical via and a through silicon optical via to connect the memory wafer to another memory wafer. It should be understood that the processes depicted in FIG. 7 represent illustrations, and that other processes may be added or existing processes may be removed, modified, or rearranged without departing from the scope and spirit of the present disclosure.

The memory wafer(s), the power delivery system, the electrical and optical interconnections and cooling system can be mechanically integrated using integrated silicon liquid cooling solutions across one or more memory wafers and/or processing elements, air cooling solutions across one or more memory wafers, and use of mechanical supports for the memory wafers and processing elements as well as any power delivery substrates, cables and frames to house one or more systems or sub-systems for system level integration. These systems or sub-systems may be used, for example, for personal computing, high performance system solutions, cloud computing systems, and may be utilized with encrypted security of communications within and/or between subsystems or systems to aide in security and privacy of information.

The flowchart and block diagrams in the Figures illustrate the architecture, functionality, and operation of possible implementations of systems, methods, and computer program products according to various aspects of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various examples of the present disclosure have been presented for purposes of illustration, but are not intended to be exhaustive or limited to the embodiments disclosed. Many modifications and variations will be apparent to those of ordinary skill in the art without departing from the scope and spirit of the described techniques. The terminology used herein was chosen to best explain the principles of the present techniques, the practical application or technical improvement over technologies found in the marketplace, or to enable others of ordinary skill in the art to understand the techniques disclosed herein.

What is claimed is:

1. A method for manufacturing an integrated wafer-level processing system comprising:
    forming a memory wafer comprising a plurality of memory elements; and
    electrically and physically connecting a processing element to the memory wafer, wherein the processing element is configured to transmit data to and receive data from the plurality of memory elements;
    wherein the processing element is directly connected to the memory wafer via a data connection such that the data connection connects directly between the processing element and the memory wafer without using an intermediary circuit board between the memory wafer and the data connection and the processing element and the data connection, the plurality of memory elements and the processing element being on a same side of the memory wafer; wherein the data connection is disposed between the processing element and the memory wafer only near one peripheral area of said processing element, the remaining peripheral areas of said processing element being free of data connections;
    wherein the data connection is a wire connection or an optical connection such that one end of the wire connection or the optical connection is connected to the processing element and an opposite end of the wire connection or the optical connection is connected to the memory wafer;
    wherein the processing element directly connects to the wire connection or the optical connection and the wire connection or the optical connection directly connects to the memory wafer;
    wherein the processing element is positioned center of the memory wafer.

2. The method of manufacturing the integrated wafer-level processing system of claim 1, further comprising:
    forming a dicing channel on the memory wafer.

3. The method of manufacturing the integrated wafer-level processing system of claim 2, wherein the dicing channel is used for a through silicon optical via to connect the memory wafer to another memory wafer to establish a signal interconnection.

4. The method of manufacturing the integrated wafer-level processing system of claim 1, wherein the data connection is a continuous piece.

* * * * *